United States Patent
Kumar

(10) Patent No.: US 12,501,725 B2
(45) Date of Patent: Dec. 16, 2025

(54) PHOTODETECTOR TO SUPPRESS A TRAPPING OF CHARGES IN PHOTODIODES IN IMAGING APPLICATIONS

(71) Applicant: KONINKLIJKE PHILIPS N.V., Eindhoven (NL)

(72) Inventor: Abhishek Kumar, The Hague (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 142 days.

(21) Appl. No.: 17/435,856

(22) PCT Filed: Mar. 5, 2020

(86) PCT No.: PCT/EP2020/055764
§ 371 (c)(1),
(2) Date: Sep. 2, 2021

(87) PCT Pub. No.: WO2020/182588
PCT Pub. Date: Sep. 17, 2020

(65) Prior Publication Data
US 2022/0157880 A1     May 19, 2022

(30) Foreign Application Priority Data
Mar. 13, 2019    (EP) .................................... 19162544

(51) Int. Cl.
*H10F 39/18*    (2025.01)
*H10F 39/00*    (2025.01)

(52) U.S. Cl.
CPC ......... *H10F 39/189* (2025.01); *H10F 39/016* (2025.01); *H10F 39/024* (2025.01); *H10F 39/8027* (2025.01); *H10F 39/8057* (2025.01)

(58) Field of Classification Search
CPC ......... H01L 27/14658; H01L 27/14607; H01L 27/14685; H01L 27/14692;
(Continued)

(56) References Cited

U.S. PATENT DOCUMENTS

| 5,677,539 A | 10/1997 | Apotovsky |
| 9,812,491 B2 | 11/2017 | Tamaki et al. |

(Continued)

FOREIGN PATENT DOCUMENTS

| JP | S63239981 S | 10/1988 |
| JP | H7211879 A | 8/1995 |

(Continued)

OTHER PUBLICATIONS

PCT International Search Report, International application No. PCT/EP2020/0555764, Apr. 30, 2020.

*Primary Examiner* — Jennifer D Bennett
(74) *Attorney, Agent, or Firm* — Larry Liberchuk

(57) ABSTRACT

A photodetector (100) for medical imaging applications, in particular computer tomography applications, is provided. The photodetector (100) comprises a photodiode array (100a) having a plurality of photodiodes (110). Each has a bulk sensitive area (111) comprising amorphous state material and a periphery (112) at photo-lithographically defined edges (112) of the photodiode (110). The photodetector (100) furthermore comprises metal bias lines (132) directly at the periphery (112) of the bulk sensitive area (111) of the photodiode (110). A charge trapping suppressing unit (130, 140) configured to suppress a trapping of charges at the edges (112) of the photodiodes is provided.

12 Claims, 4 Drawing Sheets

(58) Field of Classification Search
CPC ......... H01L 27/14623; H01L 27/14687; H01L 27/14632; H10F 39/189; H10F 39/016; H10F 39/024; H10F 39/8027; H10F 39/8057; H10F 39/026
See application file for complete search history.

(56) References Cited

U.S. PATENT DOCUMENTS

| | | | |
|---|---|---|---|
| 2005/0111612 | A1 | 5/2005 | Ikhlef |
| 2008/0310585 | A1 | 12/2008 | Ikhlef |
| 2009/0309036 | A1* | 12/2009 | Deliwala ............. H01L 27/1446 |
| | | | 257/446 |
| 2010/0067001 | A1 | 3/2010 | Corbeil |
| 2011/0133060 | A1 | 6/2011 | Yu |
| 2011/0148574 | A1 | 6/2011 | Simon |
| 2013/0075591 | A1 | 3/2013 | Otake |
| 2017/0018588 | A1 | 1/2017 | Karim |
| 2017/0092673 | A1* | 3/2017 | Miyamoto ........ H01L 27/14616 |
| 2021/0384236 | A1* | 12/2021 | Hou ................. H01L 27/14658 |

FOREIGN PATENT DOCUMENTS

| | | |
|---|---|---|
| JP | 2007109905 A | 4/2007 |
| JP | 2014207392 A | 10/2014 |
| WO | WO2012070171 A1 | 5/2012 |
| WO | WO2012120653 A1 | 9/2012 |
| WO | WO2015067335 A1 | 5/2015 |
| WO | WO2018105359 A1 | 6/2018 |

\* cited by examiner

PHOTODETECTOR TO SUPPRESS A TRAPPING OF CHARGES IN PHOTODIODES IN IMAGING APPLICATIONS

FIELD OF THE INVENTION

The present invention relates to a photodetector for imaging applications and a method of manufacturing a photodetector for imaging applications.

BACKGROUND OF THE INVENTION

In medical imaging applications like computed tomography applications, a photodetector is required to detect incoming photons. In order to reduce the cost of an image acquisition application detector, photodetectors having photodiodes based on an amorphous state material have been proposed. However, trap sites for the charge carriers are created in amorphous state materials due to imperfections along bulk layer thickness and impurities present during deposition. Photodetectors with amorphous state material suffer from charge trapping in defect sites at the material level which reduces the performance of the photodetector unlike their crystalline counterparts.

US 2005/0111612 A1 discloses a computer tomography detector with an optical mask layer to reduce cross talk artifacts.

US 2013/0075591 A1 discloses a photodetector with a photodiode array. Each photodiode of the photodiode array has a bulk sensitive area and a periphery.

US 2011/0133060 A1 discloses a photodetector with a photodiode array having a plurality of photodiodes which have a bulk sensitive area made from crystalline silicon.

WO 2012/120653 A1 also discloses a photodetector with photodiodes which have a bulk sensitive area made from crystalline silicon.

WO 2018/0153591 discloses a photodetector having a plurality of photodiodes which each have a bulk sensitive area made from crystalline silicone.

SUMMARY OF THE INVENTION

It is an object of the invention to provide a photodetector for imaging applications with an improved efficiency. It is in particular an object of the invention to provide a photodetector for medical applications which is cost effective but allows a very fast image acquisition.

This object is solved by a photodetector for imaging applications, in particular high speed imaging applications. The photodetector comprises a photodiode array having a plurality of photodiodes. Each photodiode has a bulk (photo) sensitive area and a periphery at photo-lithographically defined edges of the photodiode. The bulk sensitive area comprises an amorphous state material. The edges of the bulk sensitive material can also comprise amorphous state material. The photodetector furthermore comprises a charge trapping suppressing unit configured to suppress a trapping of charges at the edges of the photodetector. This is in particular advantageous as the negative influence of charges trapped at the edges of the photodetector on the performance of the photodetector is reduced.

The charge trapping suppression unit comprises metal bias lines at the periphery of the bulk sensitive material of the photodiode. The metal bias lines are connectable to a voltage source such as to bias the metal bias lines to repel carries of same polarity as the polarity of the bias lines. Thus the charges or charge carriers are repelled by electromagnetic forces.

It should be noted that amorphous state material in particular amorphous state silicon is cheaper than crystalline silicon.

According to an embodiment, the charge trapping suppressing unit comprises a shadow mask covering the photodiode array. The shadow mask has a plurality of openings which are smaller than the bulk sensitive areas of the photodiodes such that the edges of the photodiodes are covered by the mask.

During the photo-lithography process, the photodiodes are patterned such that edges at the periphery are created. Patterning of the photodiode is performed to avoid lateral charge migration due to potential bias difference among the neighbouring pixels which could lead to crosstalk and decrease the image quality. Pixels can be defined by the pixellization of either top or bottom or both metal electrode of the photodiode.

According to an embodiment, the photodiodes comprise a bottom metal electrode, the bulk light sensitive material with its periphery at photolithographically defined edges and a top metal electrode. The top metal electrode is facing incoming light and the bottom electrode is facing away from the incoming light.

According to an embodiment, the metal bias lines are not in contact with the bottom electrode and the top metal electrode. This is advantageous as a short circuit between the bottom and top electrode can be avoided.

According to an embodiment, a bias of the photodiodes (110) is zero.

According to an embodiment, the photodiode has a bottom metal electrode, a bulk sensitive organic material and a top metal electrode.

According to an embodiment, a method of manufacturing a photodetector for imaging applications, in particular computer tomography applications, is provided. A photodiode array having a plurality of photodiodes is manufactured using photo-lithography. Each photodiode has a bulk sensitive area and a periphery at photo-lithographically defined edges of the photodiodes. The bulk sensitive material comprises an amorphous state material. Metal bias lines are applied at the periphery of the bulk sensitive material of the photodiode, wherein the metal bias lines are connectable to a voltage source to bias the metal bias lines to repel charges from trap sites at the edges of the photodiode. In addition or alternatively, a shadow mask is provided covering the photodiode area. The shadow mask has a plurality of openings which are smaller than the bulk sensitive are of the photodiode such that the edges of the photodiode are covered by the mask.

According to an embodiment, a method of detecting photons with a photodetector is provided. A bias voltage is applied to the metal bias lines and/or a shadow mask is provided over the photodiodes. The photons are detected with the photodiode array. The bias of the photodiodes is zero.

According to an embodiment, an imaging system is provided which comprises at least one photodetector as described above. The imaging system can be embodied as a computed tomography system or alternatively as an X-ray system. The imaging system is in particular a medical imaging system.

The shadow mask can be embodied as a light masking element which can be placed at the edges of the photodiode.

Alternatively, the shadow mask can be patterned during photo-lithography e.g. in form of a metal element.

The photodetector for imaging applications, in particular for computed tomography applications or X-ray applications according to an embodiment enables a mitigation of higher residual signals in an amorphous photodiode enabling a faster image acquisition. This is achieved by providing a photodiode array with a number of photodiodes. The photodiodes have a bulk light sensitive area and a periphery due to photo-lithographically defined edges around the light sensitive area. Around the periphery of the light or photo sensitive areas of the photodiodes, metal bias lines are provided which are biased at an appropriate voltage and appropriate polarity depending on which carriers are read out from the photodiodes to external electronics. As an alternative or in addition to the metal bias lines, a shadow mask is provided over the photodiode array with openings which are smaller than the light sensitive areas of the photodiode. Thus, edges of the light sensitive arrays of the photodiodes are covered by the shadow mask.

With the photodetector, the occurrence rate of generated charge carriers (incidental light absorbance falling in the defect sites which are typically concentrated at the photodiode edges) can be significantly suppressed. Such sites are present at the edges of the photodiode and are a result of dangling bonds. They become dominant in smaller photodiodes. Thus, higher residual signals creating lag effects are caused by a slow release of charge carriers from the trap sites-present at the edges of the photodiode. Image lag in a photodetector due to a slow release of charge carriers from charge trap sited (in particular at the edges of the photo diodes) are detrimental for a fast image acquisition in e.g. medical imaging applications like computed tomography CT application.

According to an embodiment, the imaging system with the photodetector is embodied as a computed tomography system or as X-ray application. Here, a photodetector with a very fast response time as well as very low residual signals is required. Preferably, the residual signal specification for such an imaging system in particular computed tomography application is below 1500-2000 ppm (parts per million) for low light intensity levels where the signal output from photodiodes are around 10 nA. Here, the photodetectors are measured at 0V bias at a light pulse time of 450 ms and a light signal level of 10 nano ampere. The response time of the photodiodes of the photodetector according to an embodiment can be 10 µs for the rise time and the fall time.

If the bulk sensitive area of the photodiodes increase, the amount of bulk defects will also increase in the silicon of the photodiodes. An increase of defects lead to an increase image lag. If the size of the bulk sensitive area is decreased, this will lead also to a decrease amount of bulk defects. However, the effects of defects at the edge of the photodiode will become more prominent for smaller sized bulk sensitive areas. In other words, the smaller the size of the bulk sensitive area, the more prominent the effects of the edges of the bulk sensitive area. The effect of the defects at the edges of the photodiodes can become the dominant defects as charge trapping occurs at the edges of the photodiode. A very high surface area of volume ratio in photodiodes will tend to show the bad effect of charge trapping in the amorphous state photodiodes. This will lead to a reduced response time of the photo diode. The width and/or length of the photodiodes can be approx. 150 µm.

The silicon of the bulk sensitive area of the photodiode can be amorphous or crystalline silicon. However, preferably amorphous silicon is used to reduce the cost of the photodetector. Alternatively, the photodiode can be made from organic semiconductor also to reduce the cost of the photodetector.

According to an embodiment, the photodetector comprises bottom metal electrode (e.g. an indium tin oxide ITO), a bulk (photo) sensitive material of the photodiode with its periphery at photo-lithographically defined edges, and top metal layer. At the photo-lithographically defined edges of the photodiode, the metal bias lines are provided. Preferably, this is performed to avoid any connection with both metal contacts to avoid short circuit. Also connection with either of the top or bottom electrode should be avoided to have good efficiency in suppressing charge trapping at the photodiode edges. The metal bias lines do not touch the bottom and top electrodes of the photodiode.

According to an embodiment, a computed tomography with at least one photodetector as described above is provided.

Photo-lithography is used to manufacture the photodiodes and the photodetector. The photodiodes are patterned in a pixelated structure. Photo-lithography is a process used in microfabrication to pattern parts of a thin film or a bulk of a substrate. In particular, light is used to transfer a geometric pattern from a photomask to a light sensitive resist. A photo resist is exposed and developed. Alternatively, Etching may be used to create the desired structures. Hence, the photodiodes have edges which are created during the photo-lithography process. Etching can be performed by dry etching or wet etching process depending on the nature of the amorphous state materials. Amorphous silicon can be easily dry etched.

According to an embodiment, a medical imaging system in form of an X-ray computed tomography system is provided. The imaging system comprises at least photodetectors as described above and an continuous X-ray source. The photodiodes of the photodetector are not reversed bias but have zero bias voltage. Accordingly, a medical imaging system is provided which has a low cost photodetector with photodiodes with amorphous state material, wherein the photodetector is still able to perform high speed imaging at low cost. This is achieved by using photodiodes with amorphous state material and providing bias metal lines at the periphery of the bulk sensitive material of the photodiodes.

Further aspects of the invention are defined in the dependent claims.

Advantages and embodiments of the invention are elucidated with reference to the figures.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
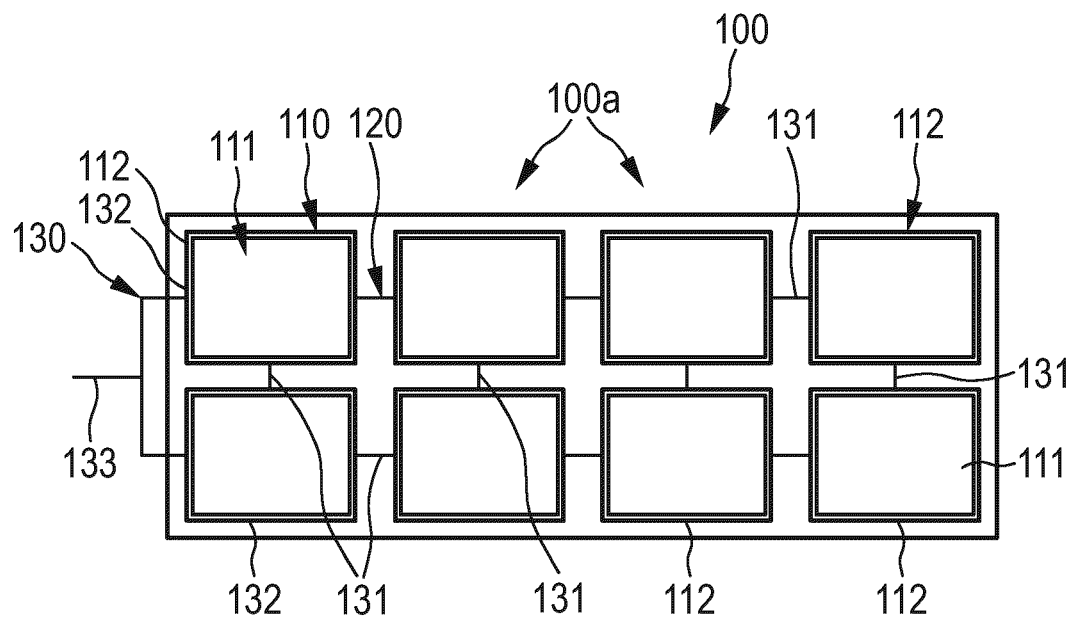
FIG. 1 shows a schematic top view of a photodetector according to an embodiment.

FIG. 1 shows a schematic top view of a photodetector according to an embodiment. The photodetector 100 comprises a photodiode array 100a having a plurality of photodiodes 110. Each photodiode 110 has a light sensitive area 111 and a periphery 112 in particular at photo-lithographically defined edges of the photodiode 110. Between adjacent photodiodes 110 of the photodiode array 100a, spaces 120 are present.

To reduce or suppress a trapping of charges in the photodiodes 110, a charge trapping suppressing unit is provided. The charge trapping suppressing unit can be embodied as a (metal) bias line 132 directly at the edges 112 of each photodiode 110. The (metal) bias lines 132 of the respective photodiodes 110 are interconnected via connecting lines 131 and are connected via lines 133 to a voltage source such that the metal bias lines 132 can be biased as required.

Accordingly, the photodetector 100 comprises a plurality of photodiodes 110 which are spaced apart from each other by spaces 120. Each photodiode 110 has a bias line 132 arranged directly at the periphery of the light sensitive area 111 of the photodiode 110. The bias line unit 130 can be coupled via a line 133 to a voltage source in order to bias the bias lines 132, 130, 133. As an example, the photodiodes 110 can be segmented and pixelated photodiodes and can have e.g. a size of 2 mm×2 mm with a circumference of 8 mm. However, it should be noted that also other sizes for the photodiode array are possible.

The distance between adjacent photodiodes 110 can be selected according to the application where the photodiode array 100a is used as a photodetector.

With the bias lines 130-133 which are biased with a voltage, a charge carrier concentration around the edges of the photodiode can be suppressed. Thus, signal rise traces and signal decay traces of the photodetector are significantly increased in particular for photodetectors with photodiodes having an amorphous state material. Hence, a cheaper and faster photodetector in particular for computed tomography applications is obtained.

With the provision of the bias lines 132 (directly) around the edges 112 of the photodetectors 110, the effect of the higher defect states at the photodiode edges which can create trap sites for photo induce charge carriers is reduced. The presence of the photo induced charge carriers at the trap sites leads to a reduced speed of the photodetector as they are released in a subsequent frame or at a subsequent integration time. Accordingly, the trapping of charges is significantly decreased with the bias lines according to FIG. 1.

Because of the bias lines 132 at the edges of the photodiode, charge carriers of the same polarity are repelled and thus the charge carriers are prevented to fall in the trap sites caused by the higher defect densities at the edges of the photodiode. The bias applied via the bias lines 132 at the edges 112 of the photodiodes 110 creates an electrical field effect which can be considered as similar to the operational principle of a thin film transistor MOSFET TFT. Here, the MOSFET TFT can be switched off and on by providing a high polarity voltage biased to the gate electrode of the device. By biasing the bias lines accordingly, the same polarity charge carriers surrounding the photodiode edges are repelled. Thus, the charge trapping occurring at the photodiode edges is significantly reduced. This is in particular advantageous for smaller photodiode sizes as the influence of the edges are increased.

In other words, in contrast to a guard ring, the metal bias lines (with an appropriately applied bias) covering at least part of the photo-lithography defined edges of the bulk sensitive are of the photo diodes create an electrical field repelling charges with the same polarity at the edges of the photodiode. The metal bias lines at the edges (of the bulk sensitive area) of the photodiode act similar to a gate electrode of a MOSFET which is able to change a depletion mode to an inversion mode in a semiconductor.

Accordingly, the photodetector according to FIG. 1 is in particular advantageous for applications of computed tomography as it leads to lower residual signals in the photodiodes and make the switching devices faster.

The bulk sensitive material may comprise amorphous state material.

Figure 2:
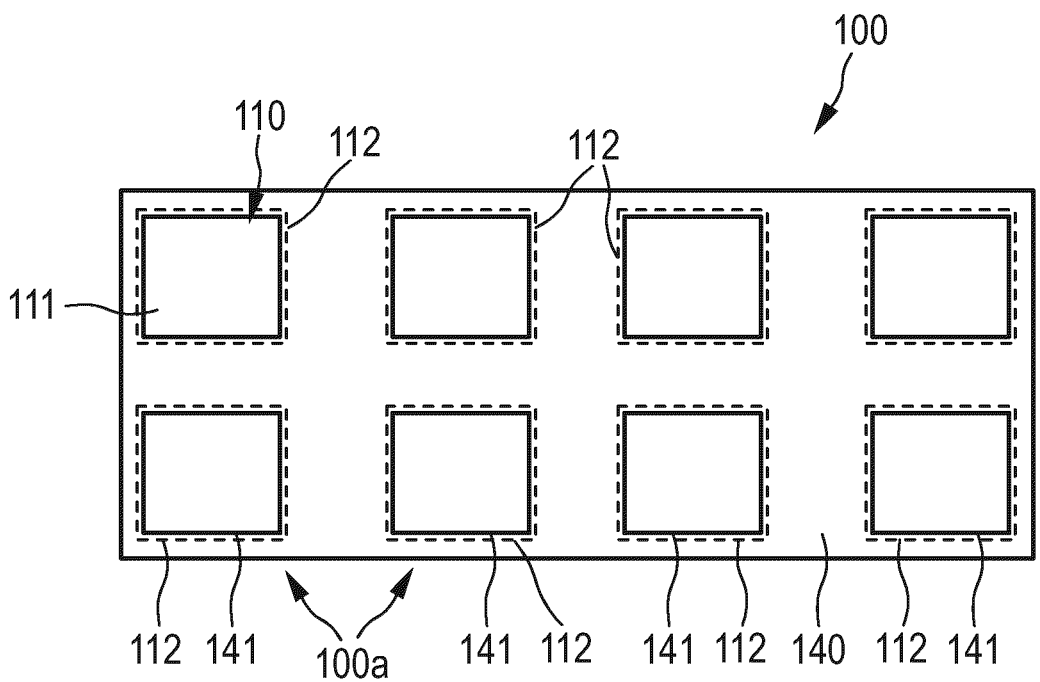
FIG. 2 shows a schematic top view of a photodetector according to a further embodiment.

FIG. 2 shows a schematic top view of a photodetector according to a further embodiment. The photodetector 100 comprises a photodiode array 100a having a plurality of photodiodes 110 which can be made of an amorphous state material. Each photodiode 110 comprises a light sensitive area 111 and an edge 112.

To reduce or suppress a trapping of charges in the photodiodes 110, a charge trapping suppressing unit is provided. The charge trapping suppressing unit can be embodied as a mask 140 having a plurality of openings 141 on top of the photodiode 110. The openings 141 are arranged over the light sensitive arrays 110 of the photodiodes 110. The dimensions of the openings 141 are selected such that the mask 140 covers the edges 112 of the photodiodes 110.

The mask 140 can be implemented as a metal shadow mask. Due to the size of the openings 141 in the mask 140, the effective light sensitive area 111 of the photodetectors are reduced as the edges 112 of the photodetector 110 are covered.

Accordingly, the photodetector according to FIG. 2 enables a mitigation of higher residual signals by arranging the shadow mask on top of the photodiode array. By the coverage of the edges 112 of the photodiodes 110 by the shadow mask 140, the edges of the photodiodes 110 are covered and are thus non-reactive to light conditions. This is in particular advantageous as it prevents any light induced charge carrier generation at the photodiode edges. Hence, charge carrier trappings at the photo edges are prevented or at least significantly reduced. It should be noted that although the effective light sensitive array of the photodiode is reduced, the contribution of the light induced charge carriers created in the bulk area of the photodiode falling into the trap sites at the edges of the photodiode is low Because of the applied vertical electrical field between the anode and the cathode of the photodiode, the vertical drift motion of the charge carriers is induced and minimizes lateral diffusion towards the edges of the photodiode.

With the photodetector according to FIG. 2, it is thus possible to minimize a concentration of trapped charge carriers at the edges of the photodiodes and thus enable a faster photodetector with lower residual signals.

According to a further embodiment, the features of FIG. 1 and FIG. 2 can be combined such that the edges 112 of the photodiodes are provided with bias lines 132 which are biased with the appropriate voltage via the bias lines 130-133. On top of the photodiodes, a shadow mask 140 can be provided with openings 141 which are smaller than the light sensitive array of the photodiodes 100a covering the edges 112 of the photodiodes 110.

The shadow mask 140 can be a light masking element which is placed on top of the photodiodes to cover at least part of the edges of the photodiodes. The shadow mask should be aligned with respect to the photodiodes to ensure a coverage of the edges of the photodiode.

Alternatively, the shadow mask can also be implemented as a metal element which can be patterned during photo-lithography. The metal elements are arranged at the edges of the photodiode and are covering at least part of the edges of the photodiode. This will enable a suppression of light interaction at the edges of the photo diode.

By means of the shadow mask 140, the edges of the photodiodes 110 are covered. In particular, the overlap can be between 0.5 μm and 5 μm, preferably 1 μm.

The bulk sensitive material may comprise amorphous state material.

Figure 3:
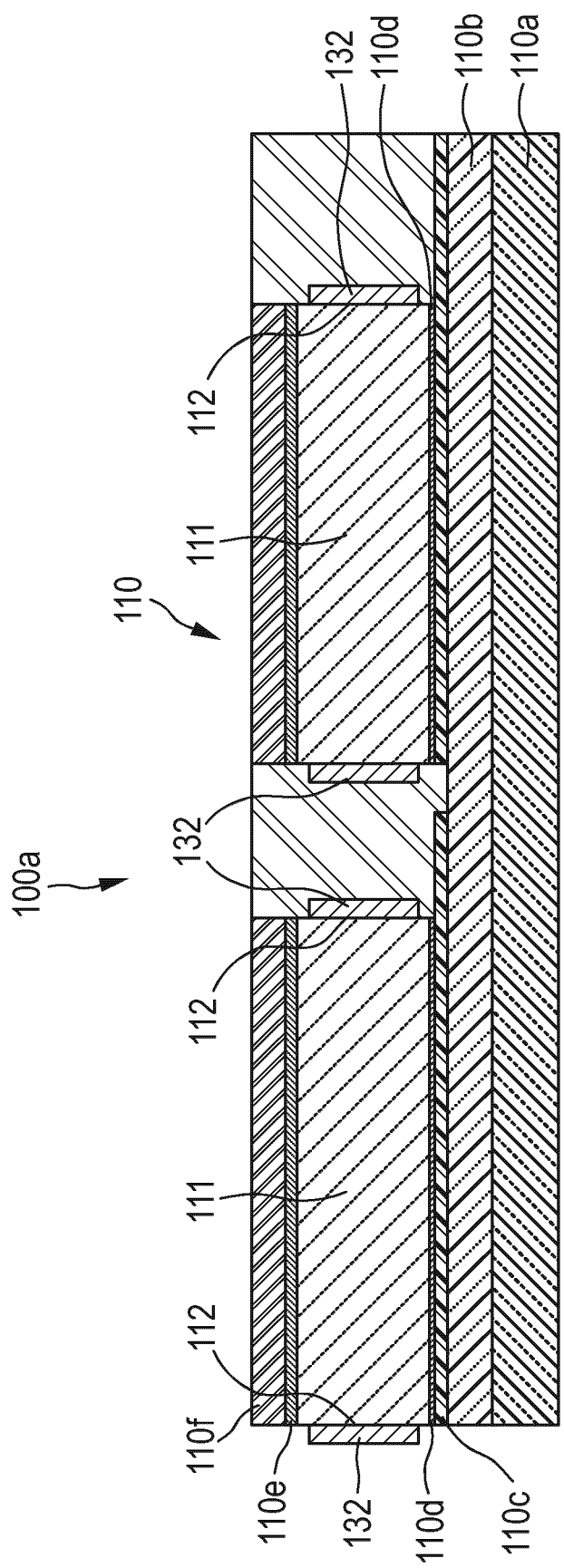
FIG. 3 shows a schematic cross section of the photodetector according to FIG. 1.

FIG. 3 shows a schematic cross section of the photodetector according to FIG. 1. In FIG. 3, a cross section of the photodetector of FIG. 1 is disclosed. In FIG. 3, an optional first layer 110a made of $Si_3N_4$, an optional second layer 110b made of $SiO_2$, a third layer 110c made of indium tin oxide ITO as bottom metal electrode, a fourth layer 110d made of p+ Si is depicted. On top of this fourth layer 110d, the bulk (photo) sensitive material 111 of the photodiode 110 with its periphery 112 at photo-lithographically defined edges are shown. On top of the bulk sensitive are 110, a fifth layer 110e made from n+Si and a sixth layer 110f made of tantalium/aluminium/tantalium Ta/Al/Ta is provided. At the photo-lithography defined edges 112 of the photodiode 110, the metal bias lines 132 are provided in direct contact of the bulk sensitive area 111.

Preferably, the metal bias lines 132 do not touch the bottom electrode and top electrodes of the photodiode 110.

The top metal electrode 110f is directed towards a light source or a photon source. The bottom metal electrode 110c is directed away from the light source or the photon source.

The bulk area 111 is made of or comprises amorphous state material.

Figure 4:
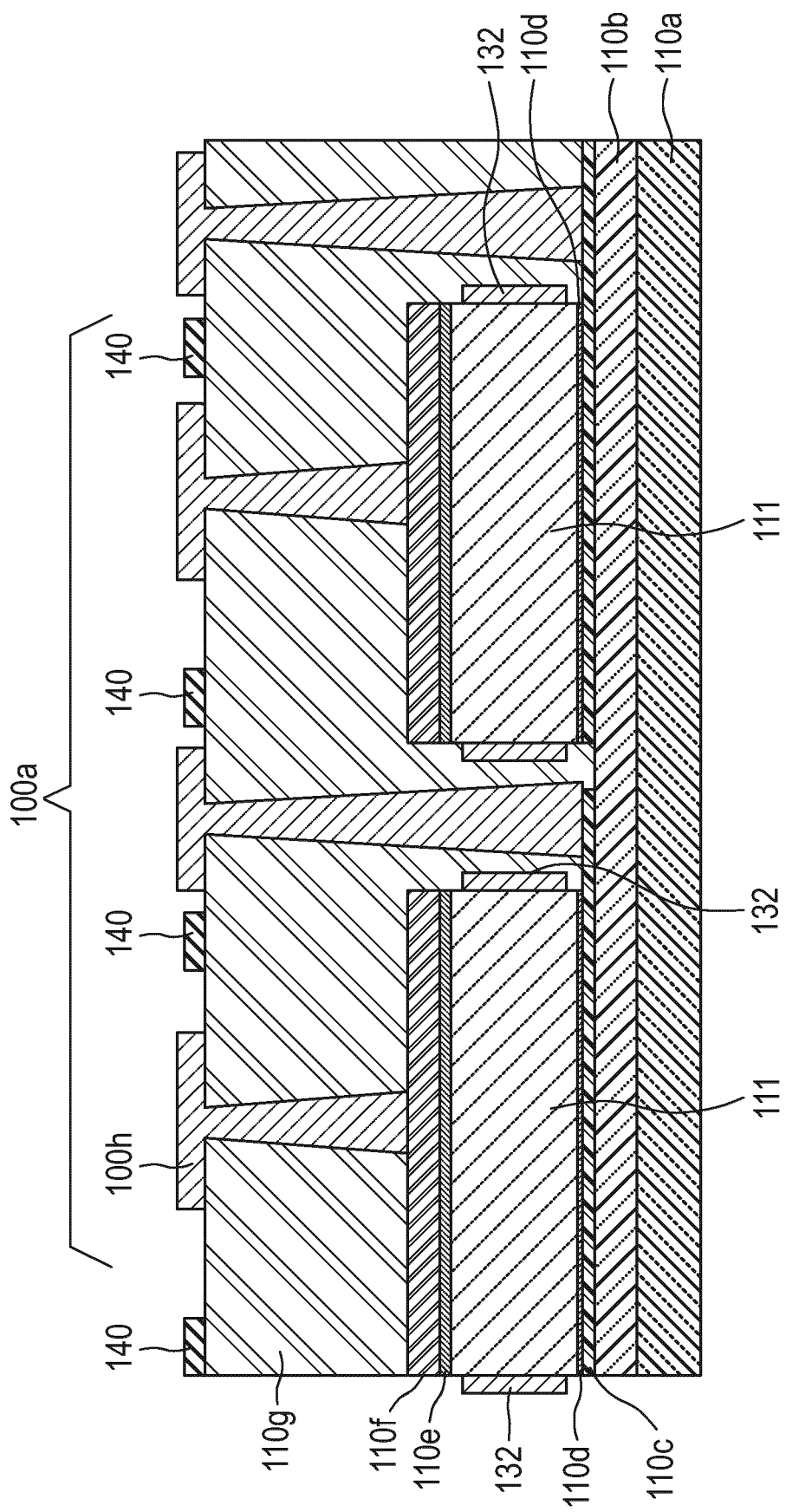
FIG. 4 shows a schematic cross section of the photodetector of FIG. 2.

FIG. 4 shows a schematic cross section of the photodetector of FIG. 2. The cross section of FIG. 4 substantially corresponds to the cross section of FIG. 3 with the additional shadow mask 140. Furthermore, an interlayer dielectric layer 100g and electrical contacts 100h are provided. The dielectric layer 100g is used to passivate the edge and the rest of the photodiodes. The electrical contacts 100g are used to contact the bottom and top electrodes of the photodiode.

According to an aspect, the n+Si layer 110e and the p+ silicon layer 110d are amorphous silicon layer. The bulk area 111 can also be made from amorphous silicon. This bulk amorphous silicon is used for light absorption and to create the charge carriers. The n+ amorphous silicon layer 110e and the p+ amorphous silicon layer 110d are used to block one of the polarity of the charge carrier.

As an alternative to amorphous silicon photodiode, organic photodiodes may also be used. Organic photodiodes can be provided at low cost as the organic material is cheap as compared to crystalline silicon.

The bias metal lines surrounding the edges of the photodiode are used to repel charges of the same polarity when such charges are near the trap sites at the photodiodes edges. Thus, the rate of charge trapping is reduced at the photodiode edges. This effect is even more reduced by using a bias line when the photodiode is biased at 0V as compared to the case of any reverse bias. At 0V the lateral diffusion of the charge carriers towards the edges of the periphery is higher and hence more charge trapping.

The shadow mask can be used alternatively or in addition to the bias metal lines. The shadow mask with the coverage at the photodiode edges can be additionally used to prevent light induce charge carriers in at the edges of the bulk sensitive area 111.

According to an embodiment, the photodetector 100 comprises bottom metal electrode 110c (e.g. an indium tin oxide ITO), a p+ Si layer 110d, a bulk photo sensitive material 111 of the photodiode 110 with its periphery 112 at photo-lithography defined edges, a n+Si layer 110e and top metal layer (e.g. made of tantalium/aluminium/tantalium Ta/Al/Ta). At the photo-lithography defined edges 112 of the photodiode, the metal bias lines 132 are provided. The metal bias lines 132 do not touch the bottom and top electrodes of the photodiode.

According to a further embodiment, the photodiodes are embodied as organic photodiodes. In this case the photodiodes comprise a bottom metal electrode, a bulk sensitive organic material and a top metal electrode.

Figure 5:
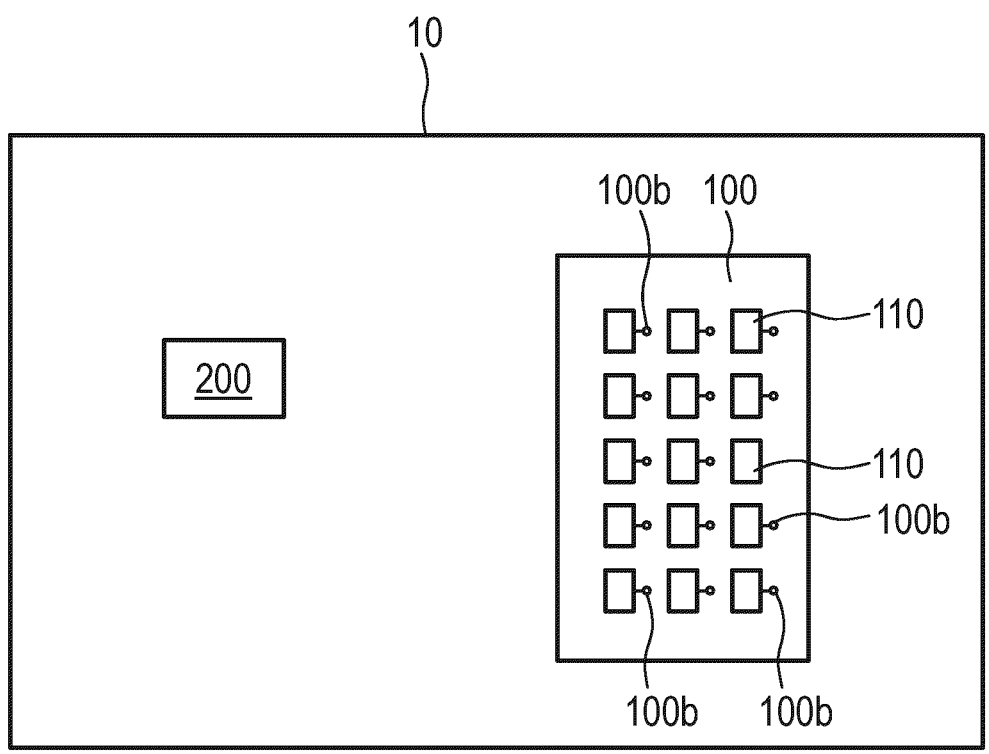
FIG. 5 shows a schematic block diagram of an imaging system according to an embodiment.

FIG. 5 shows a schematic block diagram of an imaging system according to an embodiment. The imaging system 10 comprises an X-ray source 200 and at least one photodetector 100. The photodetector 100 comprises a photodiode array having a plurality of photodiodes 110. Each photodiode 110 can be biased by a bias voltage 100b. The photodetector 100 may correspond to the photodetector according to the FIGS. 1 to 3 as described above. In addition, the bias voltage 100b of each photodiode 110 is zero. In other words, the photodiodes are not reversed biased.

The X ray source 200 is preferably a continuous X-ray source 200.

By avoiding a reserved bias of the photodiodes 110 which comprise amorphous state material, a low dark leakage current can be achieved. Accordingly, by not biasing the photodiodes, the dark leakage current is reduced as compared to a photodetector with reversed biased photodiodes. On the other hand, by avoiding a reversed bias of the diodes, the probability of lateral diffusion of charge carriers to the edges of the photodiodes is increased as compared to a photodetector with reversed bias photodiodes. Accordingly, for a photodetector which uses photodiodes with amorphous state material and without any reverse bias, the need to take care of charge trapping at the periphery of the bulk sensitive area becomes more important. This problem is, however, solved according to the embodiments by providing metal bias lines at the periphery of the bulk sensitive material which in turn comprises amorphous state material. For reversed biased photodiodes in a photodetector, a vertical drift motion of the charge carriers in the electrical field of the reversed biased photodiodes lead to a decrease lateral diffusion. As this is not applicable anymore for a photodetector with photodiodes without any reversed bias, charge trapping suppressing steps must be provided.

According to an embodiment, a computed tomography system with at least one photodetector as described above is provided.

According to an embodiment, an imaging system with a photodetector is provided in form of an X-ray system for medical imaging applications.

The imaging system can also be embodied as a security scanning system.

The imaging system with a photodetector as described above has a residual signal specification of around 1500-2000 ppm (parts per million). The photodetectors are measured at 0V bias at a light pulse time of 450 ms and a light signal level of 10 nano ampere.

According to an aspect, X-ray computed tomography systems are provided where there is a continuous X-ray source unlike other systems when pulsed X-ray is provided. Computer tomography application require very fast imaging and thus signal rise traces and signal decay is more clearly visible in combination with low X-ray dose leading to low light signals from scintillator to be absorbed by photodiode. Under low light conditions, the charge trapping phenomena in amorphous silicon is very high.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A photodetector for imaging applications, comprising:
    a photodiode array having a plurality of photodiodes, each photodiode of the plurality of photodiodes comprising a bottom electrode, a bulk sensitive area, a periphery at edges of the photodiode, and a top electrode, wherein the top electrode faces an incoming light and the bottom electrode faces away from the incoming light; and
    a charge trapping suppressing unit configured to suppress a trapping of charges at the periphery, wherein the charge trapping suppressing unit comprises metal bias lines in direct contact at the periphery, the metal bias lines being connectable to a voltage source to bias the metal bias lines to repel carriers of same polarity as a bias line polarity from trap sites at the periphery, wherein the charges are moved in a direction perpendicular to the periphery towards a central region.

2. The photodetector according to claim 1, wherein the charge trapping suppressing unit comprises a shadow mask covering the photodiode array, the shadow mask having a plurality of openings smaller than the bulk sensitive area, such that the edges of the photodiodes are covered by the mask.

3. The photodetector according to claim 1, wherein a bias of the photodiodes is zero.

4. The photodetector according to claim 1, wherein the bulk sensitive area comprises a bulk photosensitive organic semiconducting material.

5. An imaging system comprising at least one photodetector according to claim 1.

6. The imaging system according to claim 5, wherein the imaging system comprises an X-ray computed tomography system.

7. The imaging system according to claim 5, wherein the imaging system comprises a security scanning system.

8. The imaging system according to claim 5, further comprising an X-ray source, wherein the photodiodes of the photodetector have a bias of zero volt.

9. The photodetector according to claim 1, wherein the metal bias lines are not in contact with the bottom electrode and the top electrode.

10. A method of manufacturing a photodetector for medical imaging applications, comprising:
    manufacturing a photodiode array having a plurality of photodiodes using photo-lithography, each photodiode of the plurality of the photodiodes comprising a bottom electrode, a bulk sensitive area, a periphery at edges of the photodiode, and a top electrode, wherein the top electrode faces an incoming light and the bottom electrode faces away from the incoming light;
    applying metal bias lines at the periphery, the metal bias lines being connectable to a voltage source to bias the metal bias lines to repel carriers of same polarity as a bias line polarity from trap sites at the periphery, wherein the charges are moved in a direction perpendicular to the periphery towards a central region; and
    applying a shadow mask covering the photodiode array, the shadow mask having a plurality of openings smaller than the bulk sensitive area, such that the edges of the photodiodes are covered by the shadow mask.

11. The method according to claim 10, further comprising applying a bias voltage to the metal bias lines and detecting photons with the photo diode array, wherein the bias of the photodiodes is zero.

12. The method according to claim 10, wherein the metal bias lines are not in contact with the bottom electrode and the top electrode.

* * * * *